United States Patent [19]

Ikeda

[11] Patent Number: 5,376,811
[45] Date of Patent: Dec. 27, 1994

[54] SOLID-STATE IMAGING DEVICE WHICH GENERATES DIFFERENCE DATA AT DIFFERENT POINTS OF TIME

[76] Inventor: Yasuo Ikeda, c/o NEC Corporation, 7-1, Shiba 5-Chome, Minato-ku, Tokyo, Japan

[21] Appl. No.: 60,201

[22] Filed: May 7, 1993

[30] Foreign Application Priority Data

May 8, 1992 [JP] Japan .................................. 4-115561

[51] Int. Cl.$^5$ ...................... H01L 29/78; H01L 27/14; H01L 31/00
[52] U.S. Cl. .................................... 257/232; 257/233; 257/239; 257/240; 257/241; 377/62; 348/303; 348/305
[58] Field of Search ............... 257/231, 232, 233, 239, 257/240, 241, 243; 377/60, 61, 62; 358/213.22, 213.23, 213.25, 213.26, 213.29

[56] References Cited

U.S. PATENT DOCUMENTS

| 5,051,798 | 9/1991 | Kimura | 257/231 |
| 5,060,245 | 10/1991 | Nelson | 257/232 |

Primary Examiner—Ngan V. Ngo

[57] ABSTRACT

A solid-state imaging device which can generate finite difference data of images at different times. There are provided with photoelectrical converting sections each of which includes photodiodes disposed in a matrix array and receives incident light to generate signal charges. A signal charge difference generating section generates a signal charge difference at different times from the signal charges generated in the photoelectrical converting section. A signal charge difference transfer section transfers the signal charge difference generated as an output of the device.

18 Claims, 11 Drawing Sheets

SOLID-STATE IMAGING DEVICE WHICH GENERATES DIFFERENCE DATA AT DIFFERENT POINTS OF TIME

BACKGROUND OF THE INVENTION

1. Field of the Invention

The present invention relates to a solid-state imaging device and an image processing semiconductor device in which the solid-state imaging device is used.

2. Description of the Related Art

A conventional image processing apparatus has a structure as shown in FIG. 1. In FIG. 1, a solid-state imaging device 70 includes light receiving members 77 for photoelectrically converting incident light to generating signal charges according to the intensity of the light. Charge-coupled device 78 transfer the signal charges thus generated to an analog-to-digital (A/D) converter 71. The members 77 are disposed in a matrix array. A first memory 73, a second memory 74 and a third memory 75 respectively store digital image signals which are converted by the A/D converter 71. A central processing unit (CPU) 76 controls the solid-state imaging device 70, the A/D converter 71, the first, second and third memories 73, 74 and 75 through a data bus 72 according to a program stored in a memory (not shown). The solid-state imaging device 70, the A/D converter 71, the first, second and third memories 73, 74 and 75 and the CPU 76 are formed separately and assembled to form the image processing apparatus.

The conventional image processing apparatus operates as follows:

Light incident to the light receiving members 77 at a time $t_n$ ($t=t_n$) is photoelectrically converted to generate signal charges. The signal charges thus generated are transferred to the charge-coupled devices 78 and then transferred to the A/D converter 71 by the devices 78, in which the analog signal charges are converted to digital signals, in order to obtain the digital image data $D_n$. The image data Dn thus obtained are stored in the first memory 73 via the data bus 72 and under the control of the CPU 76.

Similar to the above, light incident to the light receiving members 77 at a time $t_{n+1}$ ($t=t_{n+1}$), which is a predetermined period late from the time $t_n$, is photoelectrically converted to generate digital image data $D_{n+1}$. The digital image data $D_{n+1}$ are stored in the second memory 74 through the data bus 72.

Next, a finite difference operation is performed using the digital signal data $D_n$ and $D_{n+1}$ stored in the first and second memories 73 and 74 respectively and as a result, image data ($D_{n+1}-D_n$) thus obtained are stored in the third memory 75. Thus, data about a finite difference between two different times or a differential at a time can be obtained.

With the conventional image processing apparatus, the analog image signals obtained in the solid-state imaging device 70 are converted to digital signals and then, stored in the first and second memories 73 and 74, so that very large capacity memories are required when the resolution of the device 70 is high. For example, in case that the picture cells of the device 70 are 640×400 and the resolution of the A/D converter 71 is 8-bit, very large-capacity memories as many as 6144-kilobit are required.

In addition, very large burdens are acted on the A/D converter 71, the CPU 76 and the data bus 72 during operation. For example, in case that the finite difference data or differential data are operated at a frequency of 30 times in one second, 256,000 times analog-to-digital conversions and finite difference operations in one second are required, respectively. In one second, 1,280,000 or more data transfers are also required.

Therefore, the conventional image processing apparatus is difficult to be downsized and high in fabrication cost. As a result, the application field of the apparatus is very narrow.

SUMMARY OF THE INVENTION

Accordingly, it is an object of the present invention to provide a solid-state imaging device which can generate finite difference data of images at different times.

It is another object of the present invention to provide an image processing semiconductor device which can be downsized and be fabricated at low cost.

In a first aspect of the present invention, a solid-state imaging device comprises photoelectrical converting sections each of which includes photoelectrical converter members disposed in a matrix array. The device receives incident light to generate signal charges according to the light. Signal charge difference generating sections generates a signal charge difference at different times in response to the signal charges generated in the respective photoelectrical converting sections. A signal charge difference transfer section transfers the signal charge differences generated in the signal charge difference generating sections to an output.

In a preferred embodiment, each of the signal charge difference generating sections comprises a first charge transfer section with a delaying function of transfer and a second charge transfer section with no delaying function of transfer. The signal charges generated in each of the photoelectrical converting sections are divided into first and second groups. The charges of the first group are transferred to the first charge transfer section. The charges of the second group are transferred to the second charge transfer section.

The delaying function of transfer may be realized by charge transfer elements or charge holding elements arranged in a row. The signal charges are delayed due to passing through the charge transfer elements, or due to holding by the elements. The elements may be disposed on the input side or the output side of the first charge transfer section.

In another preferred embodiment, each of the signal charge difference generating sections comprises one charge transfer section having a voltage transmission path. The voltage of one of the signal charges is transmitted through the voltage transmission path. On the other hand, the signal charges are transferred through the charge transfer section to give the voltage of one of the transferred signal charges. Thus, there arises a time delay between the voltages.

Preferably, a differential amplifier amplifies the signal charge difference in each of the signal charge difference generating sections.

In case that the first and second groups of the signal charges are generated, both groups of the charges are inputted to a pair of differential input terminals of the amplifier, respectively.

In case that the first and second groups of the signal charges are not generated, one voltage of the signal charge is inputted to one terminal through the voltage transmission path. The other voltage of the signal charge is inputted to the other terminal not through the path.

With the solid-state imaging device according to the first aspect of the present invention, data of images at different times are generated from the incident light to the photoelectrical converting members and the data are transferred to outputted, so that finite-difference image data can be obtained easily.

Besides, the solid-state imaging device according to the first aspect of the invention can be formed monolithicly on a semiconductor substrate. Thus, the device can be downsized and be fabricated at low cost.

In a second aspect of the present invention, an image processing semiconductor device comprises a solid-state imaging section having the same structure as the solid-state imaging device of the first aspect formed on a semiconductor substrate. An analog processing section is formed on the substrate, which processes signal charges at different times, the charges being generated in the solid-state imaging section. An analog-to-digital converter is formed on the substrate, to convert the output signal of the analog processing section to digital signals. A central processing unit is formed on the substrate, to control the solid-state imaging section so that the digital output signal of the analog-to-digital converter is processed to generate desired image data. A memory stores the image data which is generated.

With the image processing semiconductor device according to the second aspect of the present invention, the solid-state imaging device according to the first aspect of the present invention is used as the solid-state imaging section, so that the semiconductor device can be downsized and fabricated at low cost.

DETAILED DESCRIPTION OF THE PREFERRED EMBODIMENT

Figure 1:
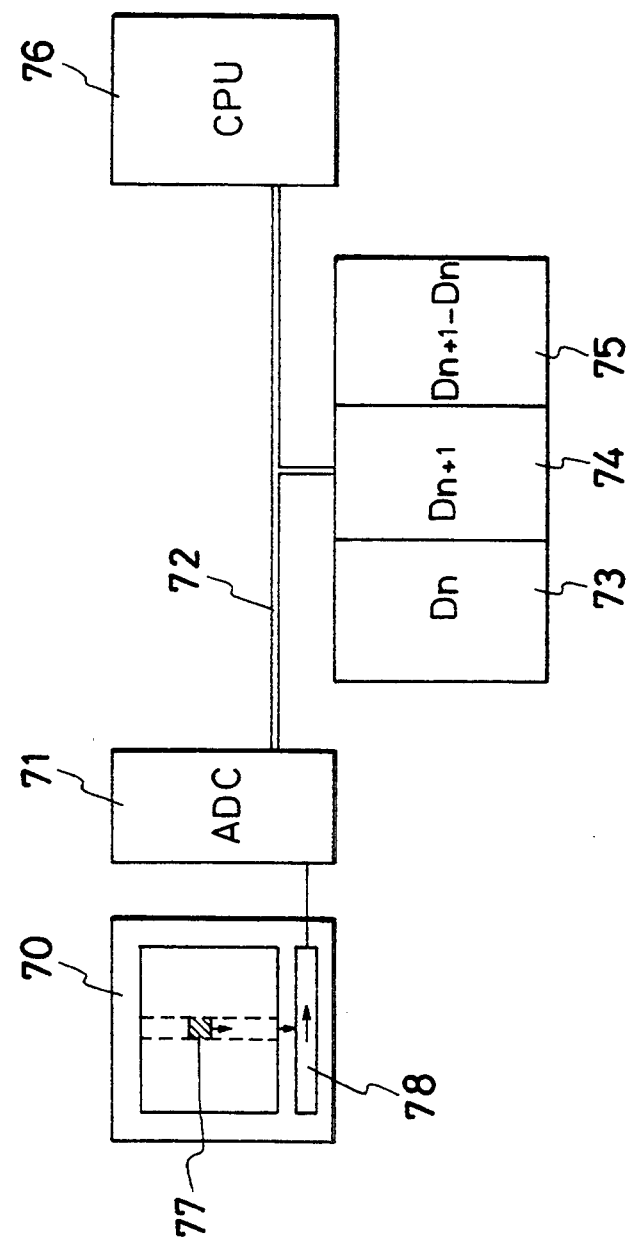
FIG. 1 is a functional block diagram which shows a conventional image processing apparatus for obtaining a finite-difference image data at different times or a differential image data at a time.

Next, preferred embodiments of the present invention will be described below referring to the drawings attached.

[FIRST EMBODIMENT]

Figure 2:
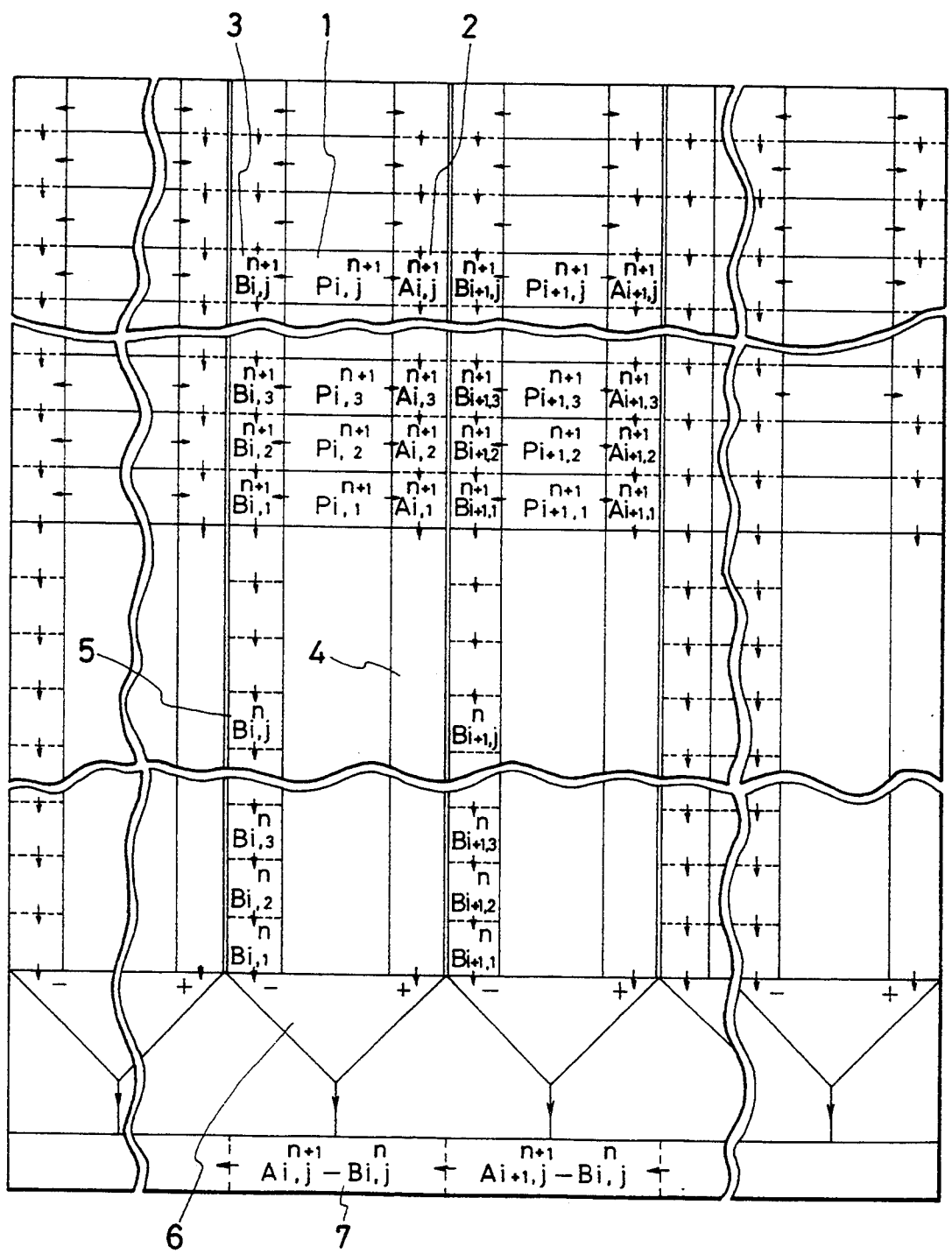
FIG. 2 is a partial plan view of a solid-state imaging device according to a first embodiment of the present invention.
Figure 3:
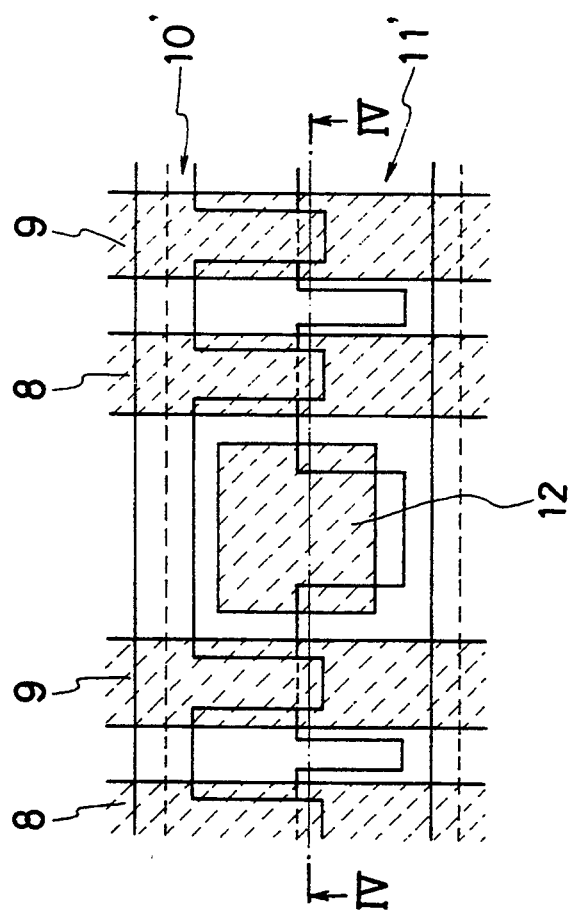
FIG. 3 shows a layout of a unit cell of a photoelectrically converting section and a vertical charge transfer section of the first embodiment.
Figure 4:
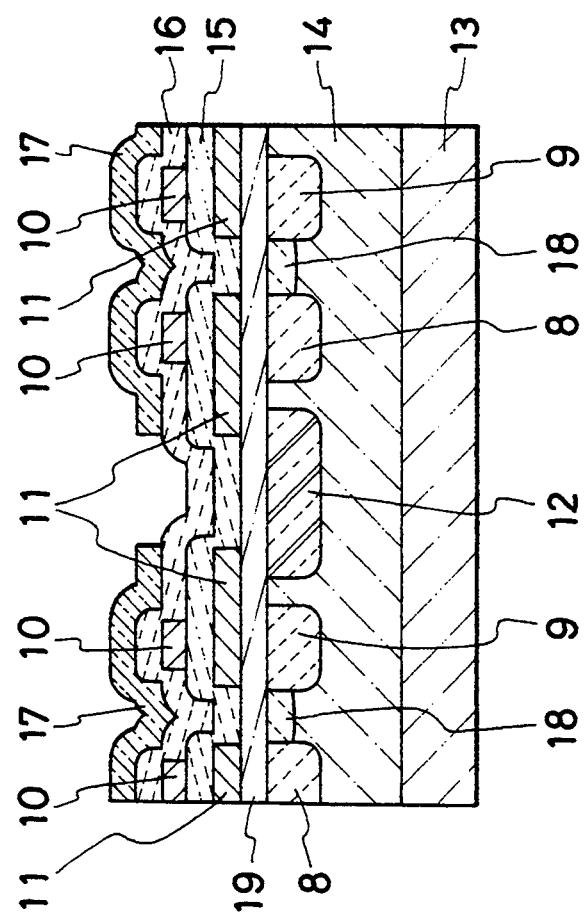
FIG. 4 is a partially cross-sectional view of the unit cell taken on line IV—IV of FIG. 3.

FIGS. 2 to 4 show a solid-state imaging device according to a first embodiment of the present invention.

In FIG. 2, the solid-state imaging device has photoelectrically converting sections 1 in which a plurality of photodiodes are vertically disposed in a row, respectively. The photodiodes are arranged in a matrix array having K rows and L columns, where K and L are both natural numbers, for example, K=640 and L=400.

The L photodiodes vertically disposed in FIG. 2 are close to each other. The K photodiodes horizontally disposed in FIG. 2 are adjacent to each other through first and second vertical charge transfer sections 2 and 3 formed therebetween. The K first vertical charge transfer sections 2 and K second vertical charge transfer sections 3 are horizontally arranged in FIG. 2, respectively.

With one row (for example, the ith row) of the vertically disposed photodiodes, the first vertical charge transfer section 2 is formed on the right side of the row. The second vertical charge transfer section 3 is formed on the left side of the row. Each of the first and second vertical charge transfer sections 2 and 3 is composed of L charge transfer devices such as charge-coupled devices disposed in a row. The charge transfer devices and the photodiodes are in a one to one correspondence. Therefore, K×L signal charges generated in the respective photodiodes are divided into two groups and transferred to the first and second charge transfer sections 2 and 3 as a first and second signal charges in response to a first synchronizing signal, respectively.

A charge transmission section 4 is formed at an end of each of the first vertical charge transfer sections 2. A third vertical charge transfer section 5 for delaying transfer is formed at an end of each of the second vertical charge transfer sections 3. The K charge transmission sections 4 and the K third vertical charge transfer sections 5 are both horizontally arranged in FIG. 2. Each of the charge transmission sections 4 is composed of a charge transfer device. Each of the third vertical charge transfer sections 5 is composed of L charge transfer devices which are vertically arranged in a row in FIG. 2.

An opposite end to the section 2 of each of the charge transmission sections 4 is connected to a positive-side (+) input terminal of a differential amplifier 6. An opposite end to the section 3 of each of the third vertical charge transfer sections 5 is connected to a negative-side (−) input terminal of the differential amplifier 6. The K differential amplifiers 6 are horizontally arranged in FIG. 2.

The first signal charges from the first vertical charge transfer section 2 are transferred to the charge transmission section 4 in response to a second synchronizing signal, and then are immediately transferred to the differential amplifier 6 through the charge transmission section 4. The second signal charges transferred from the second vertical charge transfer section 3 are transferred to the third vertical charge transfer section 5 in response to the second synchronizing signal, and then transferred to the differential amplifier 6. In the section 5, the signal charges are sequentially transferred toward the amplifier 6 whenever the second synchronizing signal is given. When the L second synchronizing signals are given, the L second signal charges are transferred to the amplifier 6.

The output terminal of each of the differential amplifier 6 is connected to a horizontal charge transfer section 7 which is composed of K charge transfer devices horizontally arranged in FIG. 2. That is, the output terminal of the amplifier 6 at the ith row is connected to the ith charge transfer device of the section 7.

The amplifier 6 differentially amplifies the voltage difference between the first and second signal charges to output to the section 7. The signal charge corresponding to the finite difference between the first and second signal charges is horizontally transferred in the horizontal charge transfer section 7 to be outputted in response to a third synchronizing signal.

Next, the operation of the solid-state imaging device having the above-described structure is shown below.

When light enters the photodiode of the jth ($1 \leq j \leq K$) column in the ith ($1 \leq i \leq L$) row in the photoelectrically converting section 1 between a time $t_{n-1}$ and a time $t_n$ ($t_n - t_{n-1} = \Delta t_1$), a signal charge $P_{i,j}{}^n$ is generated in the section 1. If a first synchronizing signal is given, the signal charge is divided into two parts and then the parts are respectively transferred to the charge transfer device of the jth column of the first vertical charge transfer section 2 and to the charge transfer device of the jth column of the second vertical charge transfer section 3 as a first signal charge $A_{i,j}{}^n$ and a second signal charge $B_{i,j}{}^n$ and held therein.

Next, the charge transfer sections 2 and 3 sequentially transfer the first and second signal charges $A_{i,j}{}^n$ and $B_{i,j}{}^n$ toward the differential amplifiers 6, respectively, in response to the second synchronizing signal having a period of $\Delta t_2$, where $\Delta t_2 < (\Delta t_1/L)$. That is both of, the signal charges $A^{i,j}{}_n$ and $B_{f,j}{}^n$ are transferred from the charge transfer device of the Lth column toward that of the 1st column.

The first signal charge $A_{i,j}{}^n$ transferred to the charge transfer device of the 1st column through the section 2 is moved to the charge transmission section 4 of the ith row when the next second synchronizing signal is given as a trigger signal. The signal charge $A_{i,j}{}^n$ is transferred immediately through the section 4 and inputted to the positive side input terminal of the ith differential amplifier 6.

The second signal charge $B_{i,j}{}^n$ transferred to the charge transfer device of the 1st column through the section 3 is moved to the charge transfer section 5 of the ith row when the next second synchronizing signal is given. The charge $B_{i,j}{}^n$ is first transferred to the charge transfer device of the Lth column, which is nearest to the section 3. And then, when the L second synchronizing signals are given as trigger signals, the L charges $B_{i,L}{}^n$, $B_{i,L-1}{}^n$, ..., $B_{i,I}{}^n$ in the section 3 are all transferred to the section 5 and stored therein.

When the first synchronizing signal is given again at a time $t_{n+1}$ which is $\Delta t_i$ later from the time $t_n$ (or $t_{n+1} - t_n = \Delta t_1$), the signal charge $P_{i,j}{}^{n+1}$ generated during the period $\Delta t_1$ in the photodiode of the jth column in the ith row is divided into two parts. Then, the parts are respectively transferred to the charge transfer device of the jth column of the first vertical charge transfer section 2 and to the charge transfer device of the jth column of the second vertical charge transfer section 3 as the first and second signal charges $A_{i,j}{}^n$ and $B_{i,j}{}^n$, and are held therein.

Next, similar to the above, the charge transfer sections 2 and 3 operate to sequentially transfer the first and second signal charges $A_{i,j}{}^{n+1}$ and $B_{i,j}{}^{n+1}$ toward the differential amplifiers 6, respectively, in response to the second synchronizing signal. That is, the signal charges $A_{i,j}{}^{n+1}$ and $B_{i,j}{}^{n+1}$ are both transferred from the charge transfer device of the jth column toward that of the 1st column.

When the next jth second synchronizing signal is given, the first signal charge $A_{i,j}{}^{n+1}$ is transferred to the charge transmission section 4 of the ith row. The second signal charge $B_{i,j}{}^{n+1}$ is transferred to the charge transfer device of the Lth column of the charge transfer section 5.

At this time, the first signal charge $A_{i,j}{}^{n+1}$ at the time $t_{n+1}$ is inputted through the section 4 to the positive side input terminal of the differential amplifier 6 of the ith row. At the same time, the second signal charge $B_{i,j}{}^n$ at the time $t_n$ is inputted through the section 5 to the negative side input terminal of the amplifier 6 of the ith row.

As a result, the amplifier 6 outputs a signal charge $C_{i,j}{}^{n+1}$ proportional to the difference between the charges $A_{i,j}{}^{n+1}$ and $B_{i,j}{}^n$, or $(A_{i,j}{}^{n+1} - B_{i,j}{}^n)$. The charge $C_{i,j}{}^{n+1}$ is stored in the charge transfer device of the ith row of the horizontally charge transfer section 7.

Finally, the section 7 operates to horizontally transfer the charge $C_{i,j}{}^{n+1}$ as an output signal of the imaging device in response to a third synchronizing signal having a period of $\Delta t_3$, where $\Delta t_3 < (\Delta t_2/K)$.

Thus, with the solid-state imaging device of the invention, the image data corresponding to the finite difference between the images at the different times $t_{n+1}$ and $t_n$ can be obtained.

FIGS. 3 and 4 show the unit cell structure of the photoelectric converting section 1 and the first and second vertical charge transfer sections 2 and 3 of the solid-state imaging device described above.

In FIG. 4, in a p-well region 14 formed on an n-semiconductor substrate 13, an n-region 12 for the photodiode is formed near the center of the region 14. On the right side of the n-region 12, an n-buried channel region 8 for the first vertical charge transfer section 2 is formed. On the left side of the n-region 12, an n-buried channel region 9 for the second vertical charge transfer section 3 is formed. P+-channel stop regions 18 for isolating other cells are formed on the right side of the n-buried channel region 8 and on the left side of the n-buried channel region 9, respectively.

The surfaces of the impurity-doped regions 8, 9, 12 and 18 and the exposed surface of the p-well region 14 are covered with an gate oxide 19. On the gate oxide 19, first gate electrodes 11 for horizontal transfer are formed. The surfaces of the first gate electrodes 11 and the exposed surface of the gate oxide 19 are covered with a first interlayer insulator film 15. On the film 15, second gate electrodes 10 for vertical transfer are formed. The surfaces of the second gate electrodes 10 and the exposed surfaces of the first interlayer insulator film 15 are covered with a second interlayer insulator film 16.

The first gate electrode 11 on the right side in the cell partially overlaps the n-region 12 and entirely overlaps the n-buried channel region 8. The first gate electrode 11 on the left side in the cell partially overlaps the n-region 12 and entirely overlaps the n-buried channel region 9.

The second gate electrode 10 on the right side in the cell entirely overlaps the first gate electrode 11 and the n-buried channel region 8. The second gate electrode 10 on the left side in the cell entirely overlaps the first gate electrode 11 and the n-buried channel region 9.

The surface of the second interlayer insulator film 16 is covered with a light-shielding metal film 17 so as not to receive the incident light, except at the surface just above the n-region 12.

In the unit cell shown in FIG. 4, the n-region 12 for the photodiode has a rectangular pattern as shown in FIG. 3. The n-buried channel regions 8 and 9 extend in parallel at each side of the region 12. The first gate electrodes 11 are formed by an electroconductive film 11′ extending horizontally and having a pattern shown in FIG. 3. The second gate electrodes 10 are formed by an electroconductive film 10′ extending horizontally in parallel to the film 11′ and having a pattern shown in FIG. 3.

In FIG. 4, it seems that the second gate electrodes 10 do not make contact with the gate oxide 19; however, as shown in FIG. 3, the electrodes 10 contact with the gate oxide 19 in areas where the first gate electrodes 11 do not exist.

The operation of the solid-state imaging device is shown below referring to FIGS. 3 and 4 again.

When light enters the n-region 12 for the photodiode, the signal charge $P_{i,j}{}^n$ is generated therein. If the first synchronizing signal is given to the gate electrodes 11, the signal charge $P_{i,j}{}^n$ is divided into two parts. Then, the parts are respectively transferred to the n-buried channel regions 8 and 9 in the first and second vertical charge transfer sections 2 and 3 as the first and second signal charges $A_{i,j}{}^n$ and $B_{i,j}{}^n$ and held therein.

Next, when the gate electrodes 11 and 10 for vertical charge transfer are driven by the quadraphase-drive method for the charge-coupled device using the second synchronizing signals, the signal charges $A_{i,j}{}^n$ and $B_{i,j}{}^n$ are sequentially transferred through the buried channel regions 8 and 9, respectively, whenever the second synchronizing signal is given. The later transfer of the signal charges $A_{i,j}{}^n$ and $B_{i,j}{}^n$ are the same as above.

Since the applied voltage by the second synchronizing signal is smaller than that by the first synchronizing signal, the vertical charge transfer of the signal charges $A_{i,j}{}^n$ and $B_{i,j}{}^n$ can be made without leakage of the charges $A_{i,j}{}^n$ and $B_{i,j}{}^n$ through the inversion layers to be formed between the n-region 12 and the n-buried channel regions 8 and 9.

To make the description simple, only the impurity-doped regions such as n-region 12 and the gate electrodes 10 and 11 are shown. The other elements are omitted in FIG. 3. The layers formed on or over the metal film 17 are omitted in FIG. 4.

[SECOND EMBODIMENT]

Figure 5:
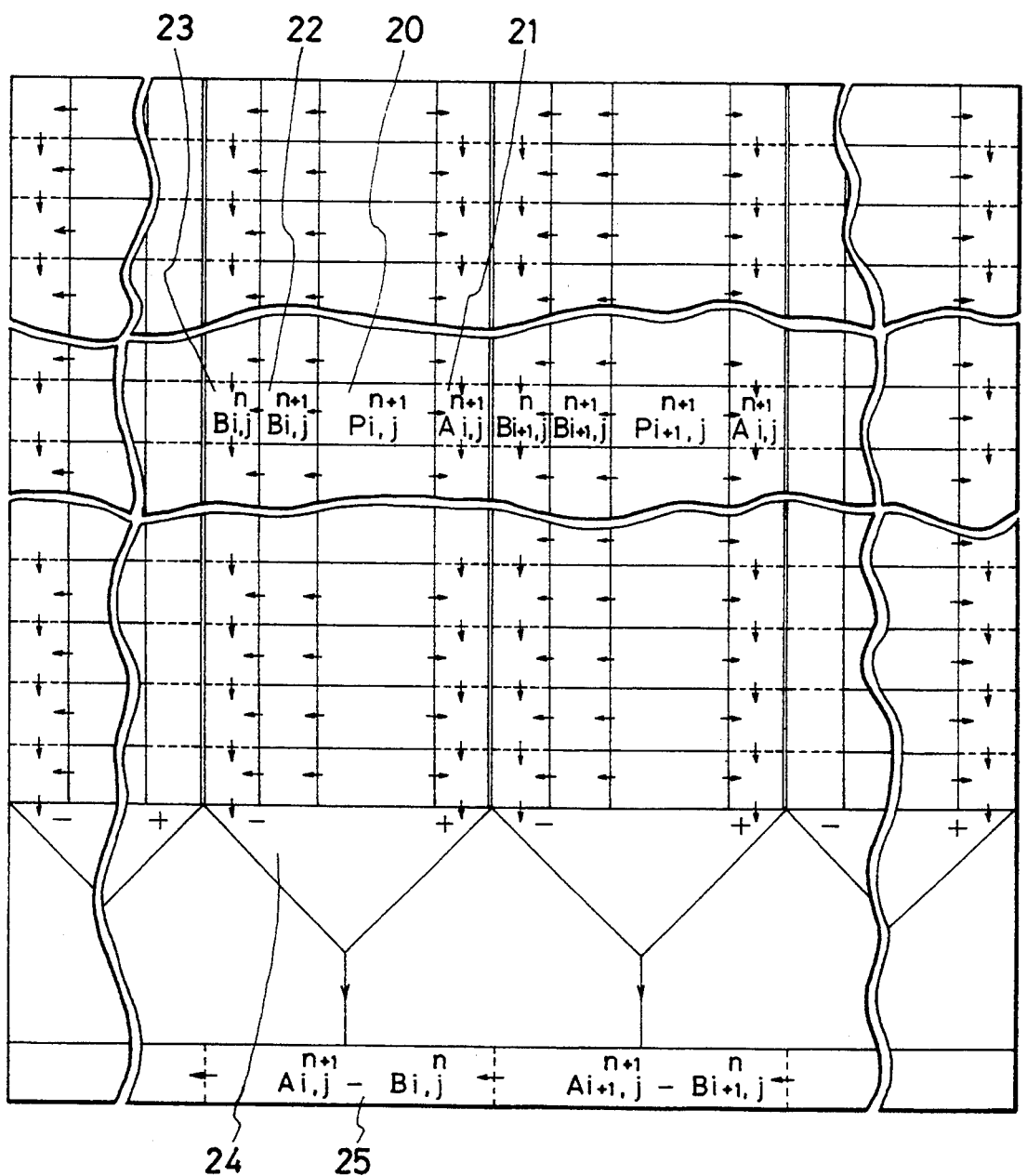
FIG. 5 is a partial plan view of a solid-state imaging device according to a second embodiment of the present invention.
Figure 6:
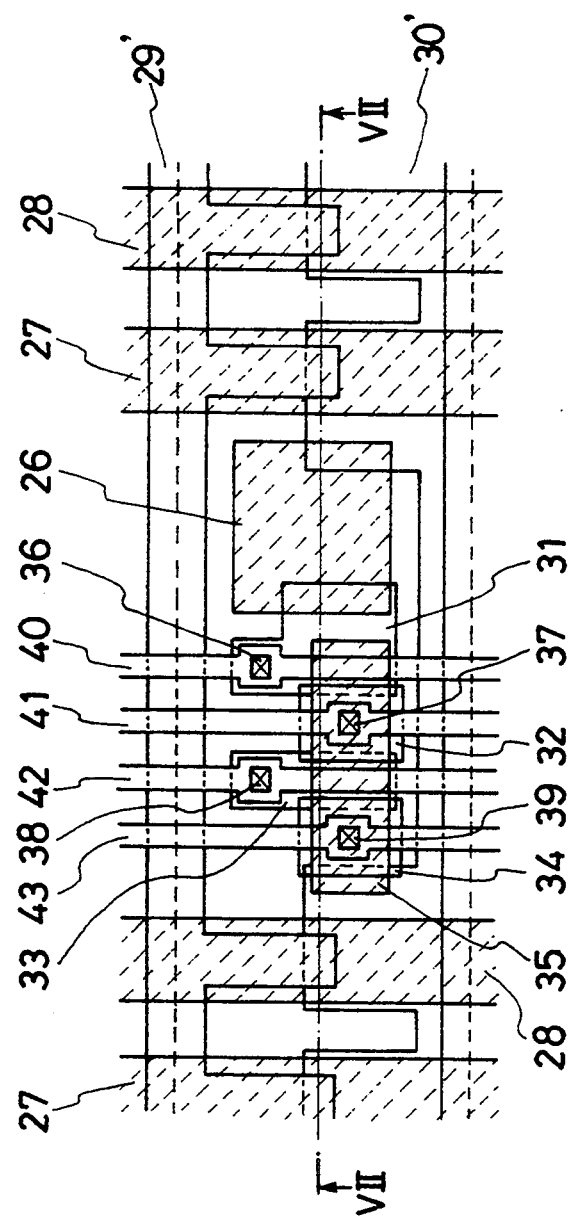
FIG. 6 shows a layout of a unit cell of a photoelectrically converting section and a vertical charge transfer section of the second embodiment.
Figure 7:
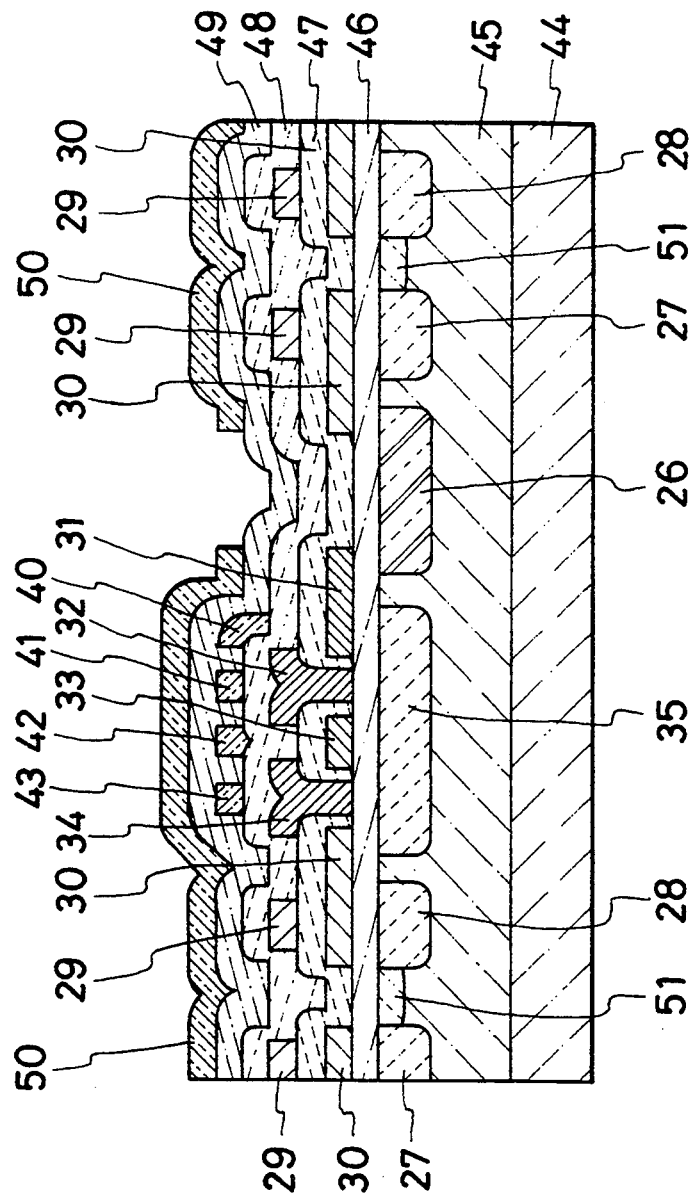
FIG. 7 is a partially cross-sectional view of the unit cell taken on line VII—VII of FIG. 6.

FIGS. 5 to 7 show a solid-state imaging device according to a second embodiment of the present invention.

In FIG. 5, similar to the first embodiment, the solid-state imaging device has photoelectrically converting sections 20 in which a plurality of photodiodes are vertically disposed in a row, respectively. The photodiodes are arranged in a matrix array having K rows and L columns, where K and L are both natural numbers, for example, K=1024 and L=1024.

The L photodiodes vertically disposed in FIG. 5 are close to each other. The K photodiodes horizontally disposed in FIG. 5 are adjacent to each other through first and second vertical charge transfer sections 21 and 23 and a charge storing section 22 formed therebetween. The K first vertical charge transfer sections 21, the K second vertical charge transfer sections 23 and the K charge storing section 22 respectively extend vertically and are horizontally arranged in FIG. 5.

With one row (for example, the ith row) of the vertically disposed photodiodes, the first vertical charge transfer section 21 is formed on the right side of the row. The charge storing section 22 and the second vertical charge transfer section 23 are formed on the left side of the row. The first and second vertical charge transfer section 21 and 23 and the charge storing section 22 is composed of L charge transfer devices such as charge-coupled devices disposed in a row, respectively. The charge transfer devices and the photodiodes are in a one to one correspondence. Therefore, K×L signal charges generated in the respective photodiodes are respectively divided into two parts and transferred to the first charge transfer sections 21 and the charge storing section 22 as a first and second signal charges in response to a first synchronizing signal. The second signal charges stored in the charge storing section 22 are sequentially transferred to the second charge transfer section 23.

An end of each of the first charge transfer sections 21 is connected to a positive-side (+) input terminal of a differential amplifier 24. An end of each of the second charge transfer sections 23 is connected to a negative-side (−) input terminal of the differential amplifier 24. K differential amplifiers 24 are horizontally arranged in FIG. 5.

The first signal charges horizontally transferred to the first vertical charge transfer section 21 are vertically transferred to the differential amplifiers 24 in response to a second synchronizing signal, respectively. The second signal charges having been stored in the charge storing section 22 in response to the prior first synchronizing signal are horizontally transferred to the second vertical charge transfer section 23 in response to the second synchronizing signal. And then, the first and second signal charges in the section 21 and 23 are vertically transferred toward the differential amplifier 6 sequentially whenever the second synchronizing signal is given. When L second synchronizing signals are given, the L first signal charges and the L second signal charges are transferred to the amplifier 24.

The output terminal of each of the differential amplifiers 24 is connected to a horizontal charge transfer section 25 which is composed of K charge transfer devices horizontally arranged in FIG. 5. That is, the output terminal of the amplifier 25 at the ith row is connected to the ith charge transfer device of the section 25.

Each amplifier 25 differentially amplifies the voltage difference between the first and second signal charges to output to the section 25. The signal charge corresponding to the finite difference between the first and second signal charges in the horizontal charge transfer section 25 is horizontally transferred through the section 25 to be outputted in response to a third synchronizing signal.

Next, the operation of the solid-state imaging device having the above-described structure is shown below.

When light enters the photodiode of the jth ($1 \leq j \leq K$) column in the ith ($1 \leq i \leq L$) row in the photoelectrically converting section 20 between a time $t_{n-1}$ and a time $t_n$ ($t_n - t_{n-1} = \Delta t_1$), a signal charge $P_{i,j}{}^n$ is generated in the section 20. If the first synchronizing signal is given at the time $t_n$, the signal charge is divided into two parts. Then, the parts are respectively transferred to the charge transfer device of the jth column of the first vertical charge transfer section 21 and to the charge transfer device of the jth column of the charge storing section 22 as a first signal charge $A_{i,j}^n$ and a second signal charge $B_{i,j}^n$ and held therein.

At this time, the second signal charge $B_{i,j}^{n-1}$, which is generated at a time $t_{n-1}$ prior to the time $t_n$ by $\Delta t_1$, is transferred from the device of the jth column of the charge storing section 22 to the device of the jth column of the second vertical charge transfer section 23.

Next, the first and second charge transfer sections 21 and 23 operate to sequentially transfer the first and second signal charges $A_{i,j}^n$ and $B_{i,j}^{n-1}$ toward the differential amplifiers 25, respectively, in response to the second synchronizing signal having a period of $\Delta t_2$, where $\Delta t_2 < (\Delta t_1/L)$. That is, the signal charges $A_{i,j}^n$ and $B_{i,j}^{n-1}$ are both transferred vertically from the charge transfer device of the Lth column toward that of the 1st column.

The signal charges $A_{i,j}^n$ and $B_{i,j}^{n-1}$ respectively transferred to the charge transfer devices of the 1st columns in the sections 21 and 23 are respectively inputted to the input terminals of the ith differential amplifier 24 when the next second synchronizing signal is given as a trigger signal.

Similar to the above, when the first synchronizing signal is given again at a time $t_{n+1}$ which is $\Delta t_1$ later from the time $t_n$ (or, $t_{n+1} - t_n = \Delta t_1$), the signal charge $P_{i,j}^{n+1}$ generated during the period $\Delta t_1$ in the photodiode of the jth column in the ith row is divided into two parts. Then, the parts are respectively transferred to the charge transfer device of the jth column of the first vertical charge transfer section 21 and to the charge transfer device of the jth column of the charge storing section 22 as the first and second signal charges $A_{i,j}^{n+1}$ and $B_{i,j}^{n+1}$ and held therein.

At this time, the second signal charge $B_{i,j}^n$ at the time $t_n$ is transferred from the charge storing section 22 to the second charge transfer section 23.

Next, the charge transfer sections 21 and 23 operate to sequentially transfer the first and second signal charges $A_{i,j}^{n+1}$ and $B_{i,j}^n$ toward the differential amplifiers 24, respectively, in response to the second synchronizing signal.

When the next synchronizing signal is given, the first signal charge $A_{i,j}^{n+1}$ at the time $t_{n+1}$ is inputted to the positive side input terminal of the differential amplifier 24 of the ith row. At the same time, the second signal charge $B_{i,j}^n$ at the time $t_n$ is inputted to the negative side input terminal of the amplifier 24 of the ith row.

As a result, the amplifier 24 outputs a signal charge $C_{i,j}^{n+1}$ proportional to the difference between the charges $A_{i,j}^{n+1}$ and $B_{i,j}^n$, or $(A_{i,j}^{n+1} - B_{i,j}^n)$. The charge $C_{i,j}^{n+1}$ is stored in the charge transfer device of the ith row of the horizontally charge transfer section 25.

Finally, the section 25 operates to horizontally transfer the charge $C_{i,j}^{n+1}$ as an output signal of the imaging device in response to a third synchronizing signal having a period of $\Delta t_3$, where $\Delta t_3 < (\Delta t_2/K)$.

Thus, also with the solid-state imaging device of the second embodiment, the image data corresponding to the finite difference between the images at the different times can be obtained.

FIGS. 6 and 7 show the unit cell structure of the photoelectric converting section 20, the first and second vertical charge transfer sections 21 and 23 and the charge storing section 22 of the solid-state imaging device described above.

In FIG. 7, in a p-well region 45 formed on an n-semiconductor substrate 44, an n-buried channel region 27 for the first vertical charge transfer section 21, an n-region 26 for the photodiode, an n-buried channel region 35 for the charge storing section 22 and an n-buried channel region 28 for the second vertical charge transfer section 23 are formed from the right side to the left. On the right side of the n-buried channel region 27 and on the left side of the n-buried channel region 28, p+-channel stop regions 51 for isolating other cells are formed, respectively.

The surfaces of the impurity-doped regions 26, 27, 28, 35 and 51 and the exposed surface of the p-well region 45 are covered with an gate oxide 46. On the gate oxide 46, first gate electrodes 30 for vertical transfer and a first, second, third and fourth gate electrodes 31, 32, 33 and 34 for horizontal transfer are formed. Second gate electrodes 29 for vertical transfer through a first interlayer insulator film 47 are formed thereon. The second electrode 32 and fourth electrode 34 for horizontal transfer extend through the first interlayer insulator film 47 to the surface thereof.

The first gate electrode 30, the second gate electrode 32 and the fourth gate electrode 34 are covered with a second interlayer insulator film 48. On the film 48, a first, second, third and fourth metal wirings 40, 41, 42 and 43 for respectively transmitting control signals to the first, second, third and fourth gate electrodes 31, 32, 33 and 34 are formed adjacently to each other. The wirings 40, 41, 42 and 43 are respectively connected to the first, second, third and fourth gate electrodes 31, 32, 33 and 34 through first, second, third and fourth contact holes 36, 37, 38 and 39 shown in FIG. 6.

The gate electrode 30 on the right side partially overlaps the n-region 26 and entirely overlaps the n-buried channel region 27. The gate electrode 30 on the left side partially overlaps the n-buried channel region 35 and entirely overlaps the n-buried channel region 28.

The gate electrode 31 is disposed between the n-region 26 and the n-buried channel region 35 and partially overlaps the both regions 26 and 35. The gate electrode 33 entirely overlaps the n-buried channel region 35. Both of the gate electrodes 32 and 34 entirely overlaps the n-buried channel region 35.

The gate electrode 29 on the right side entirely overlaps the gate electrode 30 and the n-buried channel region 27. The gate electrode 29 on the left side entirely overlaps the gate electrode 30 and the n-buried channel region 28.

The exposed surface of the second interlayer insulator film 48 and the surfaces of the wirings 40, 41, 42 and 43 are covered with a third interlayer insulator film 49, and the film 49 is covered with a light-shielding metal film 50 so as not to receive the incident light, except the surface just above the n-region 26.

In the unit cell shown in FIG. 7, the n-region 26 for the photodiode has a rectangular pattern, as shown in FIG. 6. The n-buried channel regions 27 and 28 vertically extend in parallel at each side of the region 26. The gate electrodes 30 are formed by an electroconductive film 30' extending horizontally and having a pattern shown in FIG. 6. The gate electrodes 29 are formed by an electroconductive film 29' extending horizontally in parallel to the film 30' and having a pattern shown in FIG. 6. The gate electrodes 31, 32, 33 and 34 are adjacently arranged and respectively have patterns shown in FIG. 6. The wirings 40, 41, 42 and 43 extend vertically in parallel to each other.

In FIG. 7, it seems that the gate electrodes 29 do not contact with the gate oxide 46, however, as shown in FIG. 6, the electrodes 29 contact with the gate oxide 46 in areas where the gate electrodes 30 do not exist.

The operation of the solid-state imaging device of the second embodiment is shown below referring to FIGS. 6 and 7 again.

When light enters the n-region 26 for the photodiode, the signal charge $P_{i,j}^n$ is generated therein. If the first synchronizing signal is given to the gate electrodes 30 for vertical transfer and the gate electrode 31 for horizontal charge transfer, the signal charge $P_{i,j}^n$ is divided into two parts. Then, the parts are respectively transferred to the n-buried channel regions 27 and 35 as the first and second signal charges $A_{i,j}^n$ and $B_{i,j}^n$ and held therein.

At the same time, the second signal charge $B_{i,j}^{n-1}$ transferred from the n-region 26 to the n-buried channel region 35 at a time $t_{n-1}$ is transferred from the portion just below the gate electrode 34 in the n-buried channel region 35 to the n-buried channel region 28.

Next, the gate electrodes 30 and 29 for vertical transfer are driven by the quadraphase-drive method using the second synchronizing signals. Thus, the signal charges $A_{i,j}^n$ and $B_{i,j}^{n-1}$ are sequentially transferred toward the differential amplifiers 25, respectively.

Similar to the first embodiment, since the applied voltage by the second synchronizing signal is smaller than that by the first synchronizing signal, the vertical charge transfer of the signal charges $A_{i,j}^n$ and $B_{i,j}^n$ can be made without leakage of the charges $A_{i,j}^n$ and $B_{i,j}^n$ through an inversion layer to be formed between the n-buried channel regions 35 and 28.

In the second embodiment, control signals are sequentially applied to the first, second, third and fourth gate electrodes 31, 32, 33 and 34 during transfer of the charges $A_{i,j}^n$ and $B_{i,j}^n$ in the first and second vertical charge transfer sections 21 and 23 in response to the second synchronizing signals. Thus, the charge $B_{i,j}^n$ transferred to the n-buried region 35 is then transferred from a portion just below the gate electrode 31 to another portion just below the gate electrode 34.

Also in the second embodiment, to make the description simple, only the impurity-doped regions and the gate electrodes are shown and the other elements are omitted in FIG. 6, and the layers formed on or over the metal film 50 are omitted in FIG. 7.

In the second embodiment, there is an advantage that a semiconductor chip area can be effectively used since the charge transfer section 5 in the first embodiment is not required.

[THIRD EMBODIMENT]

Figure 8:
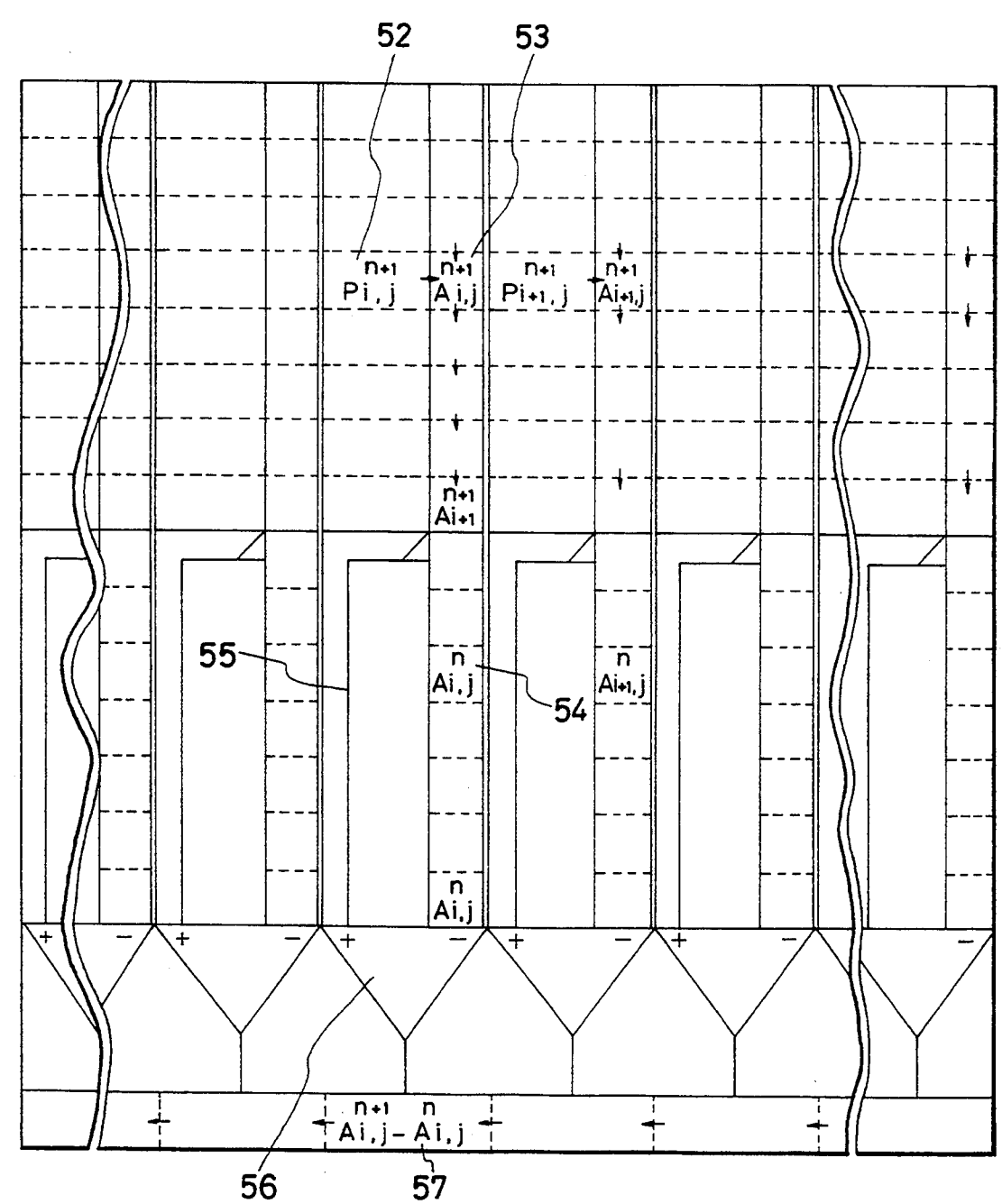
FIG. 8 is a partial plan view of a solid-state imaging device according to a third embodiment of the present invention.
Figure 9:
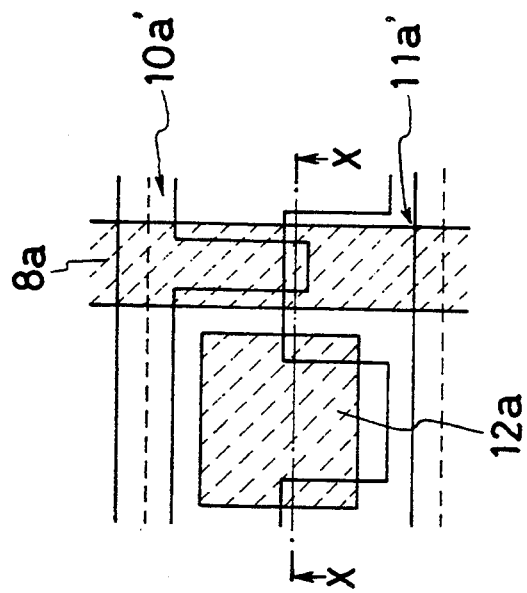
FIG. 9 shows a layout of a unit cell of a photoelectrically converting section and a vertical charge transfer section of the third embodiment.
Figure 10:
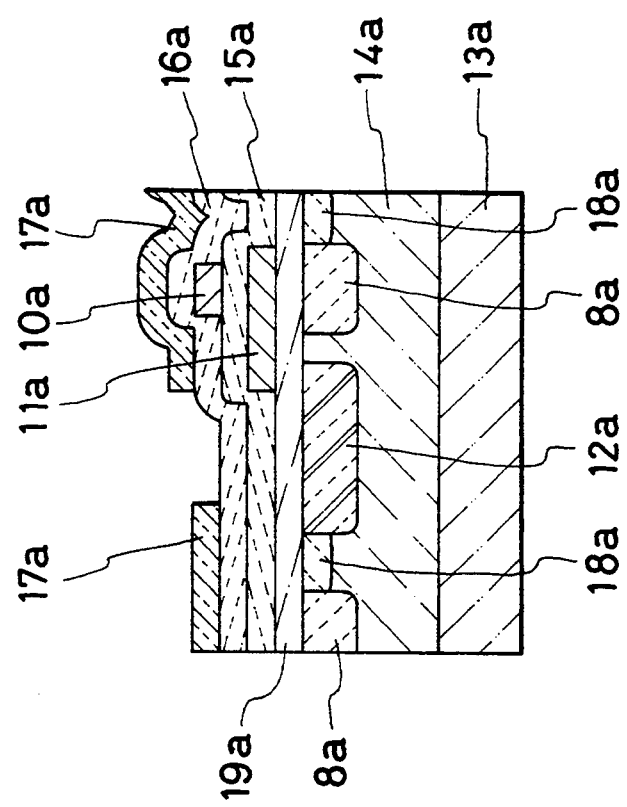
FIG. 10 is a partially cross-sectional view of the unit cell taken on line X—X of FIG. 9.

FIGS. 8 to 10 show a solid-state imaging device according to a third embodiment of the present invention. In the embodiment, signal charges generated in the photodiodes are transferred without division.

In FIG. 8, the solid-state imaging device has photoelectrically converting sections 52 in which a plurality of photodiodes are vertically disposed in a row, respectively. The photodiodes are arranged in a matrix array having K rows and L columns, where K and L are both natural numbers, for example, K=1024 and L=780.

The L photodiodes vertically disposed in FIG. 8 are close to each other, and the K photodiodes horizontally disposed in FIG. 8 are adjacent to each other through a vertical charge transfer section 53 formed therebetween. The K vertical charge transfer sections 53 are horizontally arranged in FIG. 8.

With one row (for example, the ith row) of the vertically disposed photodiodes, the vertical charge transfer section 53 is formed on the right side of the row. The section 53 is composed of L charge transfer devices such as charge-coupled devices disposed in a row. The charge transfer devices and the photodiodes are in one to one correspondence. Therefore, K×L signal charges generated in the respective photodiodes are transferred without division to the section 53 in response to a first synchronizing signal.

A charge transfer section 54 and a voltage transmission section 55 are formed at an end of each vertical charge transfer section 53. The K charge transfer sections 54 and K voltage transmission sections 55 are both horizontally arranged in FIG. 8. Each of the voltage transmission section 55 is composed of an electroconductive film. Each of the vertical charge transfer section 54 is composed of L charge transfer devices which are vertically arranged in a row.

An opposite end to the section 53 of each of the voltage transmission section 55 is connected to a positive-side (+) input terminal of a differential amplifier 56. An opposite end to the section 54 of each of the vertical charge transfer section 53 is connected to a negative-side (−) input terminal of the amplifier 56. The K differential amplifiers 56 are horizontally arranged in FIG. 8.

The signal charges transferred to the each section 53 are sequentially transferred toward the amplifier 56 through the section 54 whenever the second synchronizing signal is given. When the L second synchronizing signals are given, the L second signal charges are transferred to the amplifier 56. Thus, the voltage of the signal charge in the charge transfer device of the section 54 is applied to the negative-side input terminal of the amplifier 56.

On the other hand, the voltage of the signal charge in the charge transfer device of the section 53 is applied to the positive-side input terminal of the amplifier 56 through the voltage transmission path 56 immediately.

The output terminal of each differential amplifier 56 is connected to a horizontal charge transfer section 57 which is composed of K charge transfer devices horizontally arranged in FIG. 8. That is, the output terminal of the amplifier 56 in the ith row is connected to the ith charge transfer device of the section 57.

Each of the amplifiers 56 differentially amplifies the difference between the inputted voltages to output to the section 57. The signal charge corresponding to the finite difference between the voltages is horizontally transferred in the horizontal charge transfer section 57 to be outputted in response to a third synchronizing signal.

Next, the operation of the solid-state imaging device according to the third embodiment.

When light enters the photodiode of the jth ($1 \leq j \leq K$) column in the ith ($1 \leq i \leq L$) row in the photoelectrically converting section 52 during a time $t_{n-1}$ and a time $t_n$, where $t_n - t_{n-1} = \Delta t_1$, a signal charge $P_{i,j}^n$ is generated in the section 52. If the synchronizing signal is given at the time $t_n$, the signal charge $P_{i,j}^n$ is transferred to the charge transfer device of the jth column of the vertical charge transfer section 53 as the signal charge $A_{i,j}^n$ and held therein.

Next, the charge transfer section 53 operates to sequentially transfer the signal charges toward the differential amplifiers 56 in response to the second synchronizing signal having a period of $\Delta t_2$, where $\Delta t_2 < (\Delta t_1/L)$. That is, the signal charges are sequentially transferred from the charge transfer device of the Lth column toward that of the 1st column.

The voltage of the signal charge $A_{i,j}{}^n$ transferred to the charge transfer device of the 1st column (j=1) of each section 53 is applied to the positive-side input terminal of each amplifier 56 through each voltage transmission section 55. The charge $A_{i,j}{}^n$ is immediately transferred to each charge transfer section 54 in the ith row when the next second synchronizing signal is given as a trigger signal.

When the L second synchronizing signals are given as trigger signals, the L charges $A_{i,L}{}^n, A_{i,L-1}{}^n, \ldots, A_{i,1}{}^n$ in the ith row of the section 53 are all transferred to the section 54 and stored therein. Subsequently, when the first synchronizing signal is given again at a time $t^{n+1}$, which is $\Delta t_1$ later from the time $t_n$ ($t_{n+1} - t_n = \Delta t_1$), the signal charge $A_{i,j}{}^{n+1}$ generated during the period $\Delta t_1$ is transferred to the charge transfer device of the jth column of the vertical charge transfer section 53. And the charge $A_{i,j}{}^{n+1}$ is transferred toward the differential amplifiers 56 in the section 54 in response to the second synchronizing signals. Then, the voltage of the charge $A_{i,j}{}^{n+1}$ at the time $t_{n+1}$ is applied to the negative-side input terminal of the amplifier 56.

As a result, the amplifier 56 outputs a signal charge $C_{i,j}{}^{n+1}$ proportional to the voltage difference at the times $t_n$ and $t_{n+1}$, or ($A_{i,j}{}^{n+1} - A_{i,j}{}^n$). The charge $C_{i,j}{}^{n+1}$ is stored in the charge transfer device of the ith row of the horizontally charge transfer section 57.

Finally, the section 57 operates to horizontally transfer the charge $C_{i,j}{}^{n+1}$ as an output signal of the imaging device in response to a third synchronizing signal having a period of $\Delta t_3$, where $\Delta t_3 < (\Delta t_2/K)$.

Thus, also with the solid-state imaging device of the embodiment, the image data corresponding to the finite difference between the images at the different times $t_{n+1}$ and $t_n$ can be obtained.

As shown in FIGS. 9 and 10, the unit cell of the third embodiment has a structure similar to that of the first embodiment other than that the n-buried channel region 9 for the second vertical charge transfer section 3 and the gate electrodes 10 and 11 just above the region 9 are omitted.

In FIG. 10, in a p-well region 14a formed on an n-semiconductor substrate 13a, an n-region 12a for the photodiode is formed, and on the right side of the n-region 12a, an n-buried channel region 8a for the first vertical charge transfer section 52 is formed. P+-channel stop regions 18a for isolation are formed on the right side of the n-buried channel region 8a and on the left side of the n-region 12a, respectively.

The surfaces of the impurity-doped regions 8a, 12a and 18a and the exposed surface of the p-well region 14a are covered with an gate oxide 19a. On the gate oxide 19a, a first gate electrode 11a is formed. The surfaces of the first gate electrode 11a and the exposed surface of the gate oxide 19a are covered with a first interlayer insulator film 15a. On the film 15a, a second gate electrode 10a is formed. The surfaces of the second gate electrode 10a and the exposed surfaces of the first interlayer insulator film 15a are covered with a second interlayer insulator film 16a.

The first gate electrode 11a partially overlaps the n-region 12a and entirely overlaps the n-buried channel region 8a. The second gate electrode 10a entirely overlaps the first gate electrode 11a and the n-buried channel region 8a.

The surface of the second interlayer insulator film 16a is covered with a light-shielding metal film 16a except the surface just above the n-region 12a so as not to receive the incident light.

In the unit cell shown in FIG. 10, the n-region 12a has a rectangular pattern as shown in FIG. 9. The n-buried channel region 8a extend vertically. The first gate electrode 11a is formed by an electroconductive film 11a' extending horizontally and having a pattern shown in FIG. 9. The second gate electrodes 10a' is formed by an electroconductive film 10'' extending horizontally in parallel to the film 11a' and having a pattern shown in FIG. 9.

In FIG. 10, it seems that the second gate electrode 10a does not contact with the gate oxide 19a, however, as shown in FIG. 9, the electrode 10a contacts with the gate oxide 19 in areas where the first gate electrode 11a does not exist.

The operation of the solid-state imaging device is shown below referring to FIGS. 9 and 10 again.

When light enters the n-region 12a for the photodiode, the signal charge $P_{i,j}{}^n$ is generated therein. If the first synchronizing signal is given to the gate electrodes 11a and 10a for vertical charge transfer, the signal charge $P_{i,j}{}^n$ is transferred to the n-buried channel region 8a of the vertical charge transfer section 53 as the signal charges $A_{i,j}{}^n$ and held therein.

Next, when the gate electrodes 11a and 10a are driven by the quadraphase-drive method using the second synchronizing signals, the signal charges $A_{i,j}{}^n$ is sequentially transferred to the buried channel region 8a, whenever the second synchronizing signal is given. The later transfer of the signal charge $A_{i,j}{}^n$ is the same as above.

Also in the embodiment, to make the description simple, only the impurity-doped regions such as n-region 12a and the gate electrodes 10a and 11a are shown and the other elements are omitted in FIG. 9, and the layers formed on or over the metal film 17a are omitted in FIG. 10.

In the third embodiment, there is an advantage because the intensity of the photoelectrical converting section can be increased easily since only one vertical charge transfer section is required.

[FOURTH EMBODIMENT]

Figure 11:
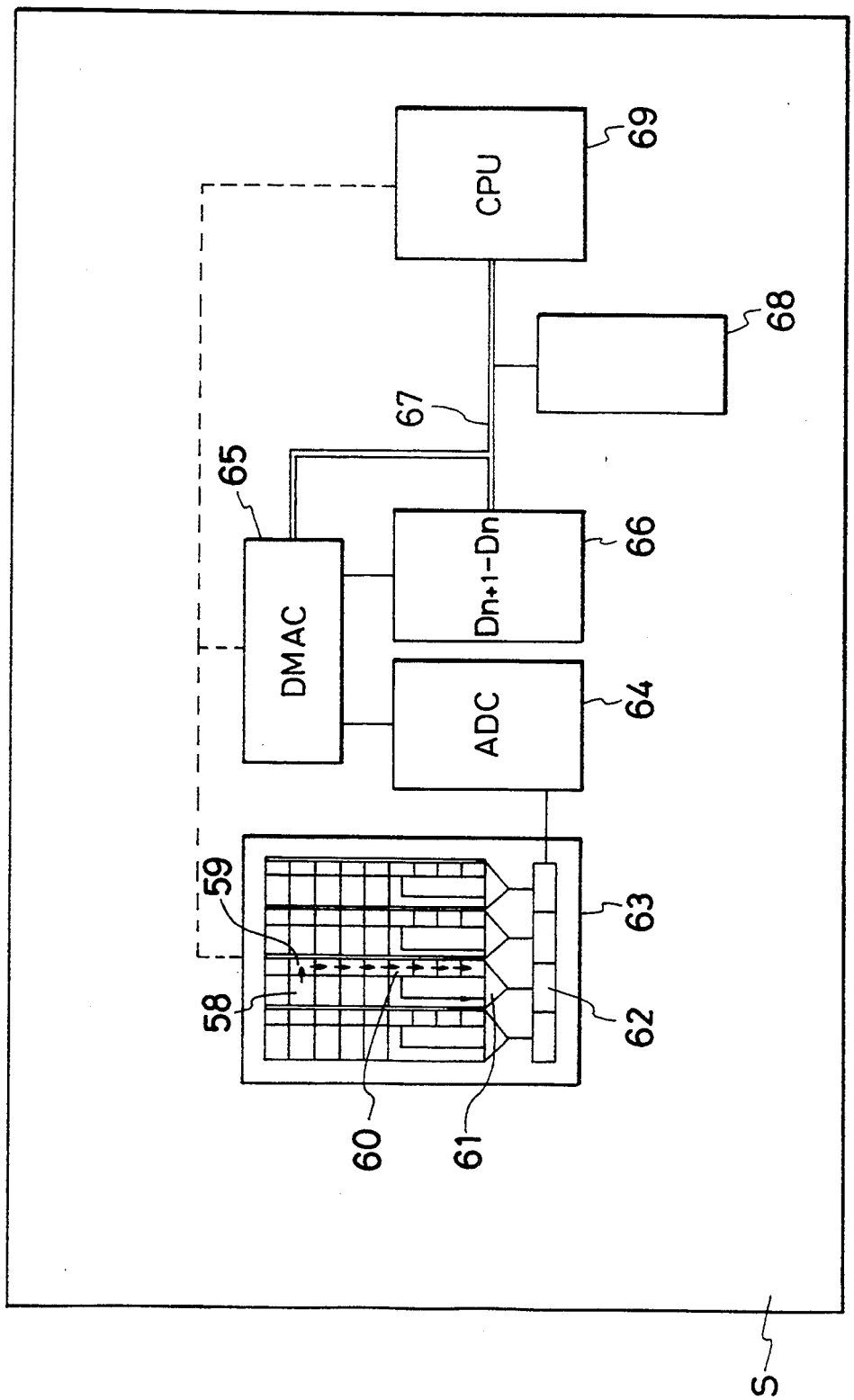
FIG. 11 is a schematic plan view of the image processing semiconductor device according to a fourth embodiment of the present invention.

FIG. 11 shows an image processing semiconductor device according to a fourth embodiment of the invention.

In FIG. 11, the image processing semiconductor device includes a solid-state imaging section 63, an analog-to-digital (A/D) converter 64, a first memory 66, a DMA controller 65, a central processing unit (CPU) 69, a second memory 68 and a bus, which are all formed on a semiconductor substrate S monolithicly.

The solid-state imaging section 63 has the same structure as the solid-state imaging device of the third embodiment. The A/D converter 64 converts the analog output signal of the imaging section 63 to a digital signal. The first memory 66 stores an output signal of the A/D converter 64. The DMA controller 65 controls the address of the A/D converter 64 and the first memory 66. The CPU 69 controls the total operations of the image processing semiconductor device and communication between the outside of the device. The second memory 68 stores a program for controlling the CPU 69.

In the solid-state imaging section 63, there are photoelectrically converting sections 58, first vertical charge transfer sections 59, second charge transfer sections 60, voltage transmission paths 60a, differential amplifiers 61 and a horizontal charge transfer section 62, each of which has the same structure as the photoelectrically converting sections 52, the vertical charge transfer sections 53, the vertical charge transfer sections 54, the voltage transmission paths 55, the differential amplifiers 56 and the horizontal charge transfer section 57 in the third embodiment, respectively.

The analog output signal of the imaging section 63 is converted to a digital signal by the A/D converter, and then stored in the first memory 66. The data stored in the memory 66 are processed according to the program stored in the second memory 68 under the control of the CPU 69, and as a result, desired imaging data can be obtained.

The image processing semiconductor device may be applied to a sensor for sensing moving objects. In this case, when the light reflected by a stationary object is incident to the photoelectrically converting sections 58, the solid-state imaging section 63 outputs a signal "zero". However, when the light reflected by a moving object is incident to the photoelectrically converting sections 58, the solid-state imaging section 63 outputs a positive or negative signal. If a bright or white object is moving, the imaging section 63 outputs positive signals in the front of the object along the moving direction, and outputs negative signals in the rear thereof.

The analog output signals are converted to digital signals by the A/D converter 64 to be stored in the first memory 66 as digital imaging data. Accordingly, if the imaging data are processed, the moving direction and/or velocity of the moving object can be obtained.

Since the solid-state imaging device in the third embodiment is used, the image processing semiconductor device can be downsized and be fabricated at low cost. As a result, the application field of the device can be made wide.

What is claimed is:

1. A solid-state imaging device comprising:
   photoelectrical converting sections each of which includes photoelectrical converter members and receives incident light to generate signal charges according to the light;
   a first signal charge transfer path for transferring said signal charges;
   a second signal charge transfer path for transferring said signal charges, said second signal charge transfer path producing a time delay in transfer as compared with said first signal charge transfer path;
   signal charge difference generating sections each of which generates a signal representing a difference between said signal charges transferred through said first and second signal charge transfer paths in order to generate said difference at different points of time; and
   a signal charge difference transfer section which transfers said signal charge differences generated in said signal charge difference generating sections to an output.

2. The solid-state imaging device according to claim 1, wherein
   each of said signal charge difference generating sections comprises a first charge transfer section with a delaying function of transfer and a second charge transfer section with no delaying function of transfer,
   said signal charges generated in each of said photoelectrical converting sections are divided into first and second groups, and
   the charges of said first group are transferred to said first charge transfer section, and the charges of said second group are transferred to said second charge transfer section.

3. The solid-state imaging device according to claim 2, wherein said delaying function of transfer is realized by charge transfer elements arranged in a row.

4. The solid-state imaging device according to claim 2, wherein said delaying function of transfer is realized by charge holding elements arranged in a row.

5. The solid-state imaging device according to claim 1, wherein each of said signal charge difference generating sections comprises one charge transfer section having a voltage transmission path.

6. The solid-state imaging device according to claim 1, wherein there is provided with a differential amplifier to amplify the signal charge difference in each of said signal charge difference generating sections.

7. The solid-state imaging device according to claim 6, wherein first and second groups of the signal charges are generated from said signal charges, and said both groups of the charges are inputted to a pair of differential input terminals of said amplifier, respectively.

8. The solid-state imaging device according to claim 6, wherein one voltage of said signal charge is inputted to one terminal of said amplifier through a voltage transmission path formed in each of said signal charge difference generating section, and the other voltage of said signal charge is inputted to the other terminal of said amplifier not through the path.

9. The solid-state imaging device according to claim 1, wherein
   said signal charge difference generating section comprises
   a first charge transfer section and a second charge transfer section which receives a first group of said signal charges generated in said photoelectrical converting section and a second group of said charges and held, respectively,
   one of said first and second charge transfer sections having a delaying function for transfer.

10. The solid-state imaging device according to claim 1, wherein
    said signal charge difference generating section comprises
    a first charge transfer section and a second charge transfer section which receive a first group of said signal charges generated in said photoelectrical converting section and a second group of said charges and hold, respectively, and
    a charge holding section in which one of said first and second groups of said signal charges are held.

11. The solid-state imaging device according to claim 1, wherein
    said signal charge difference generating section comprises
    a charge transfer section which transfers said signal charges generated in said photoelectrical converting section,
    said charge transfer section having a voltage transmission path.

12. The solid-state imaging device according to claim 9, wherein each of said signal charge difference generating section has a differential amplifier, and said first and second groups of said signal charges are inputted to a pair of the differential input terminals of said amplifier, respectively.

13. The solid-state imaging device according to claim 10, wherein each of said signal charge difference generating section has a differential amplifier, and said first and second groups of said signal charges are inputted to a pair of the differential input terminals of said amplifier, respectively.

14. The solid-state imaging device according to claim 11, wherein each of said signal charge difference generating section has a differential amplifier, and a voltage of one of said signal charges is inputted through said voltage transmission path to one of said pair of said differential input terminals of said amplifier, and another voltage of the other one of said signal charges is inputted not through said voltage transmission path to the other of said pair of said differential input terminals.

15. A solid-state imaging device comprising:
photoelectrical converting sections each of which includes photoelectrical converter members and receives incident light to generate signal charges according to the light;
each of said photoelectrical converting sections dividing each of said signal charges to generate a first signal charge and a second signal charge;
a first signal charge transfer path for transferring said first signal charges;
a second signal charge transfer path for transferring said second signal charges, said second signal charge transfer path producing a time delay in transfer, as compared with the timing in said first signal charge transfer path;
signal charge difference generating sections each of which generates a signal representing the difference between said signal charges transferred through said first and second signal charge transfer paths in order to generate said difference signals at different points of time; and
a signal charge difference transfer section which transfers said signal charge differences generated in said signal charge difference generating sections to output.

16. A solid-state imaging device as claimed in claim 15 wherein, each of said signal charge difference generating sections has a differential amplifier, and said first and second signal charges are respectively applied to differential inputs of said amplifier.

17. The solid state imaging device of claim 15 and a charge storing section between said photoelectrical converting section and one of signal charge transfer paths, said charge stored in said charge storing section during an interval between the transfer from said photoelectrical converting section to said one signal charge transfer path.

18. A solid-state imaging device comprising a matrix having rows and columns of photoelectric converting sections, each row of said photoelectric sections having charge transfer sections adjacent one side of individually associated photoelectric converting sections and an electroconductive film adjacent the other side of said photoconductive sections, said charge transfer sections and conductive film forming columns in matrix, a differential amplifier at an end of each column, each charge from said photoelectric sections being transferred through said film to one input of said differential amplifier and through a column of said charge transfer sections to the other input of the differential amplifier individually associated with the column of said film and said transfer sections, and means for delivering an output signal from said difference amplifier to an output of said matrix.

* * * * *

UNITED STATES PATENT AND TRADEMARK OFFICE
CERTIFICATE OF CORRECTION

PATENT NO. : 5,376,811
DATED : December 27, 1994
INVENTOR(S) : Ikeda

It is certified that error appears in the above-indentified patent and that said Letters Patent is hereby corrected as shown below:

On the title page: Item [73] Assignee: should read — NEC Corporation, Tokyo, Japan.

Signed and Sealed this

Thirteenth Day of February, 1996

Attest:

BRUCE LEHMAN

*Attesting Officer*  *Commissioner of Patents and Trademarks*